(12) United States Patent
Schmitt

(10) Patent No.: US 6,396,289 B1
(45) Date of Patent: *May 28, 2002

(54) AUTOMATIC ADJUSTMENT OF INCANDESCENT LAMP VOLTAGE

(76) Inventor: Jerry C. Schmitt, 17209 E. 44th St. Ct., Independence, MO (US) 64055

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/390,480

(22) Filed: Sep. 7, 1999

(51) Int. Cl.[7] ............... G01R 27/08; H05B 37/02
(52) U.S. Cl. ................. 324/713; 324/522
(58) Field of Search ................. 324/713, 522, 324/524, 541, 544; 315/307, 308

(56) References Cited

U.S. PATENT DOCUMENTS

| 4,902,958 A | * | 2/1990 | Cook, II | 323/282 |
| 5,798,619 A | * | 8/1998 | Covington | 315/307 |
| 5,859,506 A | * | 1/1999 | Lemke | 315/308 |

* cited by examiner

*Primary Examiner*—Christine Oda
*Assistant Examiner*—T. R. Sundaram
(74) *Attorney, Agent, or Firm*—Chase Law Firm, L.C.

(57) ABSTRACT

A method and apparatus determines the output voltage of a power source necessary to produce a desired lamp voltage at an incandescent lamp remote therefrom using voltage and current measurements at the power source for a circuit including a series resistor and a circuit without the resistor. Estimated circuit resistances are determined according to an algorithm that calculates the power source output voltage necessary to produce a desired lamp voltage at the lamp.

10 Claims, 3 Drawing Sheets

AUTOMATIC ADJUSTMENT OF INCANDESCENT LAMP VOLTAGE

BACKGROUND OF THE INVENTION

This invention relates to a method and apparatus for adjusting the voltage of railroad incandescent signal lamps, and, in particular, to the measurement of voltages and currents at the power source for a lamp circuit to determine the voltage setting necessary to produce a desired voltage at an incandescent lamp remote therefrom without having to measure the voltage at the lamp.

Historically, a battery has been used to drive railroad signal lamps. Typically the battery voltage is not well defined and can vary for example due to temperature changes, battery charger characteristics, loss of power, or system load variations. Because high line voltages decrease lamp life, the voltage at the lamp is commonly set lower than the rated voltage for that lamp. For example, the voltage for a ten-volt lamp will be set to nine volts to avoid a high line voltage that could burn out the bulb.

Railroad lamp voltage adjustment has been a two-person operation with one person measuring the voltage at the signal lamp and calling to a second person at the control system who adjusts a series resistor or adjustable regulator at the voltage feed point until the desired voltage is measured at the lamp. The signal lamp control system is typically fifty to two hundred fifty feet away from the signal lamps. Additionally, the length of the power cable to the signal lamps can vary widely from location to location.

Lamp bulb life can be extended if the lamp power source voltage is adjusted to an optimum operating point. At each signal location the wiring differs, in some cases substantially enough that individual lamp adjustment has become a common, and time consuming, ritual to extend signal lamp life. Lamp bulbs are regularly replaced every six months to avoid the problem and expense of a lamp burning out during operation. Additionally, because the electrical characteristics of lamps can vary by as much as twenty percent, each time a bulb is replaced the voltage has to be readjusted. Likewise, any component of the control system is replaced, the power supply voltage has to be readjusted.

SUMMARY OF THE INVENTION

It is, therefore, the primary objective of the present invention to provide a method and apparatus for determining the output voltage of a power source necessary to produce a desired lamp voltage at an incandescent lamp using voltage and current measurements at the power source.

Another important objective of the present invention is to provide a method and apparatus that eliminates the need to measure voltages at an incandescent lamp remote from the power source.

Yet another important objective of the present invention is to provide such a method and apparatus that saves time and labor cost by eliminating the need for a second person to travel to the site and measure voltages at an incandescent lamp remote from the power source.

Still another important objective of the present invention is to provide a method and apparatus that extends the life expectancy of incandescent lamps by improved control of the lamp voltage using measurements at the power source to adjust for circuit resistance.

Yet another important objective of the present invention is to provide a method and apparatus that controls and stabilizes the intensity of incandescent lamps by improved control of the lamp voltage using measurements at the power source to adjust for circuit resistance.

These and other objects of the invention are achieved by a microprocessor based system that automatically determines the voltage output required at a power source to produce a desired lamp voltage without having to directly measure the voltage at the lamp. This is accomplished by automatically measuring the voltage across a circuit that includes a 40-ohm resistor in series with a lamp output switch and a signal lamp, and measuring the current therein with the lamp dark. This is referred to as a "cold" test because the resistance of the dark lamp filament is a factor in the voltage and current measurements. The resistor is then removed from the circuit and the voltage and current for the operational circuit is measured while the filament is illuminated. This is referred to as a "hot" test because the resistance of an illuminated lamp filament is a factor in the voltage and current measurements.

A first wiring resistance, excluding the lamp filament resistance, and a more accurate second circuit resistance are calculated based on the voltage and current measurements and empirically determined constants relating to railroad signal lamps. From these calculations the power source voltage setting is determined and set without the need to directly measure the circuit resistance or the voltage at the lamp.

DETAILED DESCRIPTION

Figure 1:
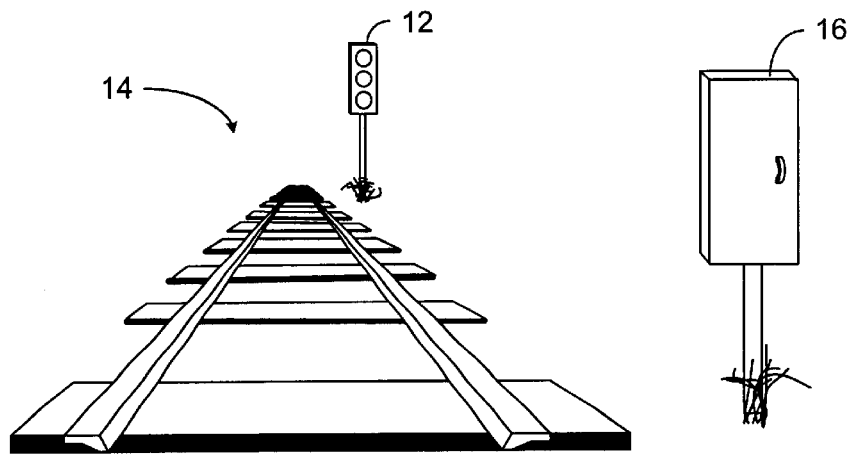
FIG. 1 is a diagrammatic view of a three-lamp wayside railroad signal and a signal controller alongside a railroad track.
Figure 3:
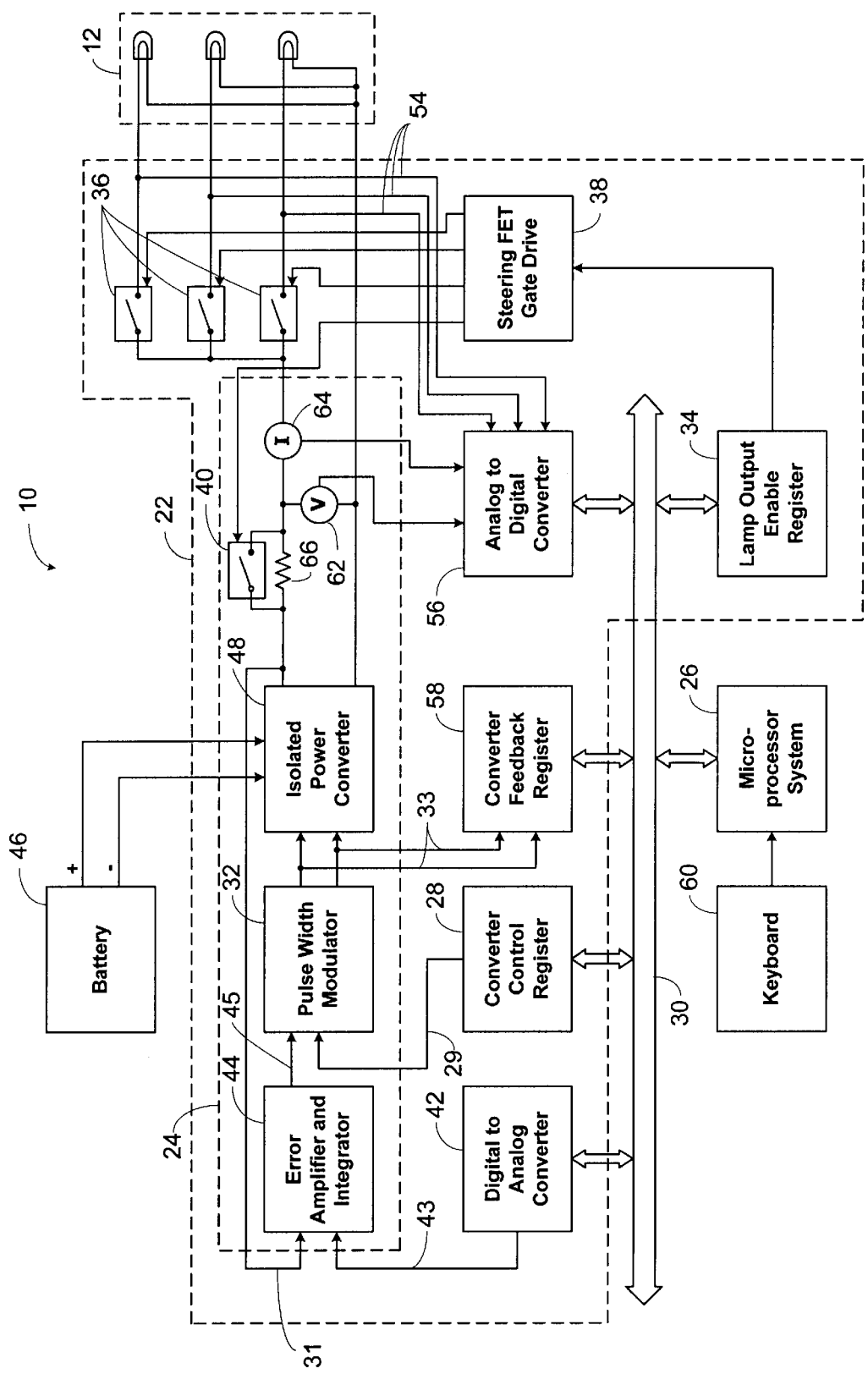
FIG. 3 is a functional block diagram of the signal lamp control system illustrating the interfaces of the major components.

Referring initially to FIGS. 1 and 3, wayside signal lamps 12 along a railroad track 14 are controlled by a microprocessor-based signal lamp controller 10 housed in cabinet 16. The three lamps 12 are illustrative of the typical red, yellow and green colors, it being understood that controller 10 may operate more or less than the three lamps 12 shown. In normal operation, microprocessor system 26 of controller 10 controls vital lamp driver module 22 which includes isolated regulated DC to DC converter 24 that regulates the voltage supplied to lamps 12. Microprocessor system 26 sends a command to control register 28 via 8-bit bus 30 which consequently sends control signals on line 29 to control the operational modes of the pulse width modulator 32.

Microprocessor system 26 enables one of the signal lamps 12 by sending a command to lamp output register 34 which in turn enables the corresponding lamp output switch 36 via steering field effect transistor (FET) gate drive 38. Steering FET gate drive 38 is a series of individually controlled solid state switches used to control lamp output switches 36 and disconnect switch 40. In normal operation, disconnect switch 40 is closed. Additionally, microprocessor system 26 sends the voltage level for the particular one of signal lamps 12 to be illuminated to digital to analog converter 42 via bus 30 which converts the digital signal to an analog voltage level which is input to error amplifier and integrator 44.

Error amplifier and integrator 44 subtracts the power converter 48 output voltage on line 31 from the input voltage on line 43 from the D/A converter 42 and integrates the result. Error amplifier and integrator 44 output voltage on line 45 is input to pulse width modulator 32. Because the output voltage of battery 46 varies over time, as well as the effects of lamp 12 load variations, the output of isolated power converter 48 is controlled by pulse width modulator 32 and the feedback through error amplifier and integrator 44 to achieve the desired voltage level output. Pulse width modulator 32 controls the voltage level output by turning isolated power converter 48 on and off such that the average voltage level output of isolated power converter 48 over time is equal to the voltage set by the microprocessor system 26.

The output of isolated power converter 48 is connected to lamp output switches 36 via a normally closed disconnect switch 40. Depending on which of lamp output switches 36 has been closed by FET gate drive 38, the corresponding one of signal lamps 12 is illuminated. Thus the voltage set by microprocessor system 26 is delivered to the signal lamp of interest.

Microprocessor system 26 monitors the outputs 54 of lamp output switches 36 via analog to digital converter 56 to ensure that the proper lamp switch has been closed as commanded. The output 33 of pulse width modulator 32 is also monitored by the microprocessor system 26 via converter feedback register 58 over bus 30. If the system is not responding as commanded by microprocessor system 26, then all lamp output switches 36 are disabled, removing power from all signal lamps 12 which in turn signals a train approaching signal lamps 12 to stop.

Figure 4:
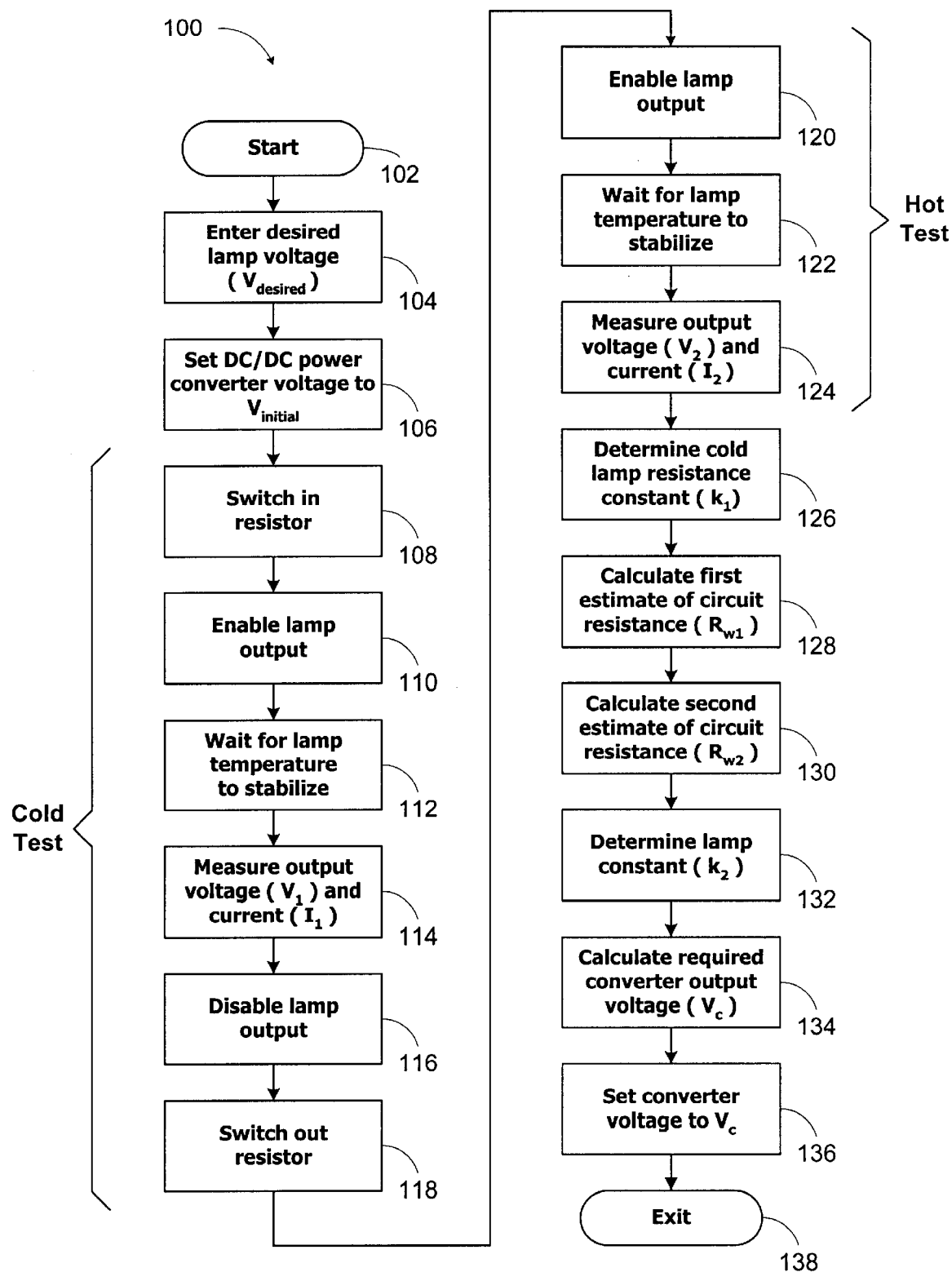
FIG. 4 is a flow chart of the software that determines the power supply output voltage to produce the desired voltage at the lamp.

When a signal lamp is replaced, the voltage to the replaced lamp is adjusted to an optimum operating voltage to extend the lamp bulb life. Referring to FIGS. 3 and 4, after a lamp is replaced, the automatic incandescent lamp voltage adjustment algorithm 100 which is executed by microprocessor system 26 starts at 102 with the railroad maintenance worker entering the desired lamp voltage ($V_{desired}$) at 104 via keyboard 60.

Railroad signal lamps are typically available from eighteen watts to forty watts (two twenty-watt lamps in parallel) in ten-volt lamps, and eighteen watts to twenty-five watts in twelve-volt lamps. If $V_{desired}$ is less than or equal to ten volts, then the initial voltage ($V_{initial}$) is set to ten volts, otherwise, $V_{initial}$ is set to twelve volts. $V_{initial}$ is the nominal or rated voltage for the signal lamp. Next the output of isolated power regulator is set to $V_{initial}$ at 106.

Blocks 108 through 118 of FIG. 4 constitute a "cold" test and blocks 120 through 124 constitute a "hot" test. For the "cold" test, the signal lamp controller 10 lamp output voltage ($V_1$) is measured by volt meter 62 and circuit current ($I_1$) is measured by ammeter 64 when series resistor 66 is inserted between isolated power converter 48 and lamp output switches 36 by opening disconnect switch 40. Before the voltage and current measurements are made, the lamp is allowed to cool very close to ambient temperature. For the "hot" test, the signal lamp controller 10 lamp output voltage ($V_2$) is measured by volt meter 62 and circuit current ($I_2$) is measured by ammeter 64 while the lamp is near normal operating temperature.

Figure 2:
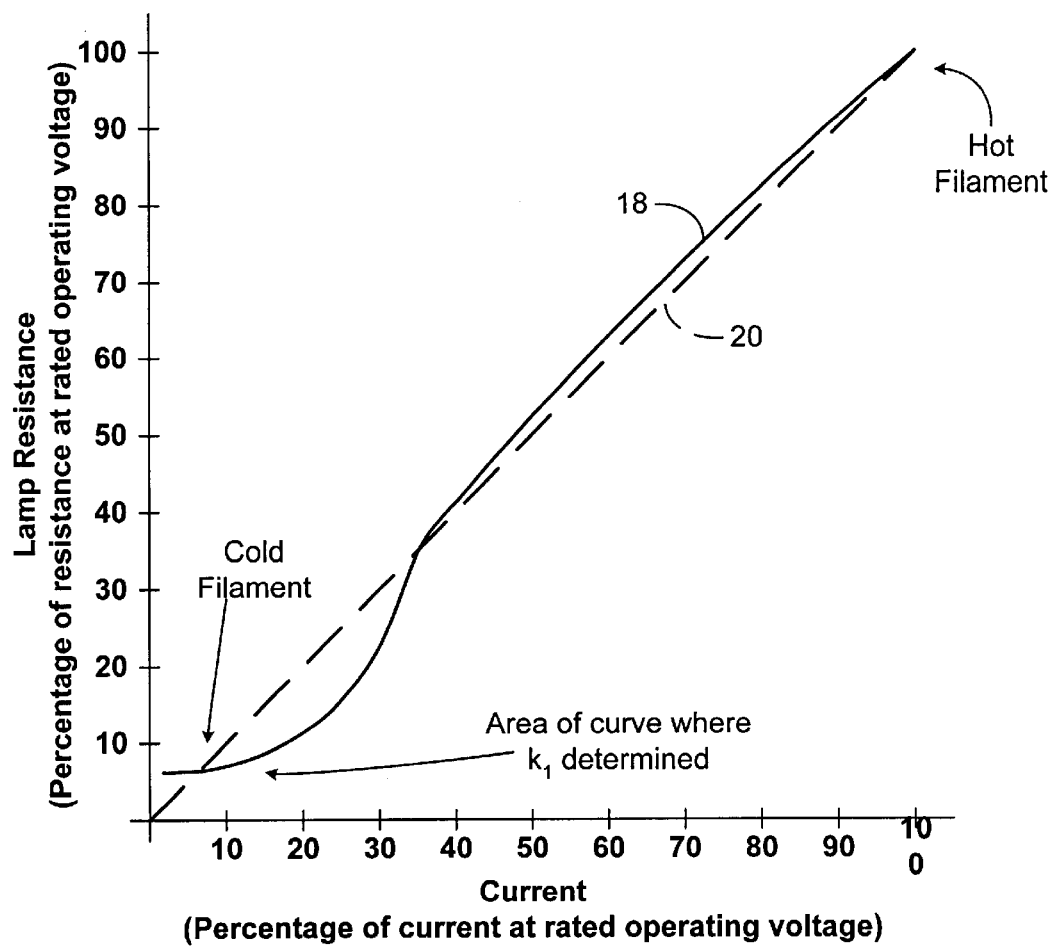
FIG. 2 is a graph of the percentage of incandescent lamp resistance as a function of the percentage of current.

Referring to FIG. 2, filament resistance 18 changes very slowly below about ten percent of the current at rated operating voltage, i.e., when the lamp is "cold." Not only does the filament resistance 18 become nearly constant at low current, but also the value varies only about +/− ten percent for various manufacturers' railroad signal lamps of the same rated lamp power. This consistency allows development of an algorithm for adjusting the lamp voltage from measurements at the power source without knowing the value of the intervening circuit resistance.

An improved estimate of the "cold" filament resistance can be obtained by also observing that the "cold" filament resistance, although dominated by a constant term, includes a factor that increases faster than the current. Experimental results have shown this increase to be closely related to the square of the percent of nominal current.

A second useful lamp filament characteristic is shown in FIG. 2. First, the relationship between lamp current and resistance, curve 18, above about forty percent of the current at rated lamp operating voltage, is nearly linear projecting through the origin. A true linear relationship is projected by line 20. Line 20 is characteristic for a square root relationship between current and voltage, i.e., the current is proportional to the square root of the voltage. The lamp current is very nearly proportional to the square root of the lamp voltage above forty percent of rated lamp current. Thus, lamp resistance changes from the dominant circuit element at normal operating voltage to a value often less than the remaining circuit resistance at low voltages.

Referring again to FIGS. 3 and 4, at block 108 the microprocessor system 26 commands lamp output enable register 34 to open disconnect switch 40 to switch in resistor 66. A forty-ohm value for resistor 66 is used to yield currents between six percent and twenty percent of the nominal lamp current for the range of lamp power and wiring resistance. The output to the replaced lamp is enabled at 110 by closing the related lamp output switch 36. After waiting for the lamp temperature to stabilize (block 112) for approximately 30 seconds and achieve near ambient temperature, output voltage ($V_1$) and current ($I_1$) are measured (114). The resulting values are converted from analog to digital by converter 56 and sent to microprocessor system 26 to be stored in a memory. Approximately twenty measurements for $V_1$ and $I_1$ are taken and averaged by microprocessor system 26 to reduce measurement noise and improve resolution. The lamp output is disabled (116) and disconnect switch 40 is closed to switch out the resistor (118).

The lamp output is again enabled at 120. After the lamp temperature has stabilized approximately 1 second (122), output voltage ($V_2$) and current ($I_2$) are measured at 124. The measured values are converted from analog to digital by converter 56 and sent to microprocessor system 26 to be stored in a memory. Approximately twenty measurements for $V_2$ and $I_2$ are taken and averaged by microprocessor system 26 to reduce measurement noise and improve resolution.

As shown in FIG. 2, and discussed herein above, the lamp resistance constant ($k_1$) representative of the filament "cold" resistance estimated from the "hot" measurements is nearly constant with a secondary term that varies roughly as the square of the percent of nominal current.

$$k_1 \text{ constant} + (\% \text{ nominal current})^2$$

Thus the cold lamp resistance constant ($k_1$) is estimated at 126 from the hot lamp measurement according to the following equation:

$$K_1 + K_1' + K_1'' * (I_1/I_2)^2$$

where $k_1'=0.092$ and
$k_1''=1.000$

The values for $k_1'$ and $k_1''$ have been empirically determined for both ten-volt and twelve-volt railroad signal lamps of various manufacture and power.

Next the first estimate of the circuit resistance $R_{w1}$ is calculated at 128 according to the following equation:

$$R_{w1}=V_1/I_1-k_1*V_2/I_2$$

The quantity $(k_1*V_2/I_2)$ is an estimate of the cold lamp resistance based on the hot lamp resistance and thus, lamp power rating. $V_1/I_1$ is the measured total circuit resistance including the circuit wiring resistance and the cold filament resistance.

The circuit resistance includes errors in $R_{w1}$ because the voltage across the signal lamp is assumed to be the isolated power converter 48 output voltage $V_2$ whereas it is actually lower due to the as yet unknown circuit wiring resistance voltage drop. The estimate of the circuit resistance is improved by calculating a second estimate of circuit wiring resistance $(R_{w2})$ at 130 using the first estimate of circuit wiring resistance to produce a more accurate second estimate according to the following equation:

$$R_{w2}=V_1/I_1-k_1*(V_2-R_{w1}*I_2)/I_2$$

Next, the lamp constant $(k_2)$ is determined at 132 based on the square root relationship of the lamp voltage and the lamp current near the nominal lamp voltage.

$$k_2=I_{lamp}/\sqrt{V_{lamp}}$$

Since $I_{lamp}$ and $V_{lamp}$ are not measured directly, $k_2$ can be approximated using the isolated converter output voltage $V_2$, lamp output current $I_2$ and estimated circuit wiring resistance $R_{w2}$ by the following equation:

$$k_2 \approx I_2/\sqrt{(V_2-R_{w2}*I_2)}$$

The required converter output voltage $(V_c)$ to yield the intended lamp operating voltage can now be estimated at 134 according to the following equation:

$$V_c=V_{desired}+R_{w2}*k_2*\sqrt{V_{desired}}$$

Microprocessor system 26 now sets the isolated power converter 48 voltage to $V_c$ at 136 and the program exits at 138. The process is repeated for each signal lamp in the system. Typically the ideal output voltage is different for each lamp. In the preferred embodiment, the voltage for each lamp is determined and added together then averaged. This average voltage is then stored and used for all lamps in the system. A separate voltage setting can also be stored for each lamp in the system. When a particular lamp is illuminated the microprocessor will set the converter output voltage to the associated voltage.

A more accurate converter voltage setting can be determined using the converter output current to calculate the voltage drop across the circuit according to the following equation:

$$V_{lamp}=V_c-I_c*R_{w2}$$

This solution requires an iterative calculation because the converter output current is not known until the converter voltage is set. Thus a converter voltage would be set, the converter current measured, the resulting lamp voltage calculated and compared to the desired lamp voltage. Any error between the calculated lamp voltage and the desired lamp voltage, above an acceptable value, would call for an appropriate adjustment to the converter voltage and repeat of the current measurement and lamp voltage calculation until the error was below the accepted value. However, this is not the preferred solution because the measurement iterations and the differences in lamps cause more variation than this solution gains in accuracy.

It is to be understood that while a certain now preferred form of this invention has been illustrated and described, it is not limited thereto except insofar as such limitations are included in the following claims and allowable functional equivalents thereof.

Having thus described the invention, what is claimed as new and desired to be secured by Letters Patent is as follows:

1. Apparatus for setting the operating voltage applied to an incandescent lamp comprising:
   means for setting an output of a power supply to an initial lamp voltage;
   a test circuit comprising a resistor in series with said lamp and said power supply;
   means for measuring a first voltage said test circuit and a first current therein;
   means for presenting said first voltage and said first current as digital data;
   an operational circuit comprising said lamp and said power supply without said resistor;
   means for measuring a second voltage across said operational circuit and a second current therein;
   means for presenting said second voltage and said second current as digital data;
   means for determining a first operational circuit resistance and a second operational circuit resistance, wherein said second operational circuit resistance is derived from said first operational circuit resistance;
   means for determining a voltage setting from said second operational circuit resistance;
   means for storing said voltage setting in a memory; and
   means for setting said output of said power supply to said voltage setting.

2. A method of determining the output voltage $(V_c)$ of a power source necessary to produce a desired lamp voltage at an incandescent lamp remote therefrom using voltage and current measurements at the power source comprising:
   (a) applying an initial lamp voltage $(V_{initial})$ to a first electrical circuit comprising a resistor in series with said incandescent lamp;
   (b) measuring a first voltage $(V_1)$ across said first circuit, and measuring a first current $(I_1)$ therein;
   (c) applying said initial lamp voltage to a second electrical circuit comprising said incandescent lamp without said resistor;
   (d) measuring a second voltage $(V_2)$ across said second circuit, and measuring a second current $(I_2)$ therein;
   (e) deriving a cold lamp resistance constant $(k_1)$ from the following equation:

$$k_1=k_1'+k_1''*(I_1/I_2)^2;$$

wherein $k_1'$ and $k_1''$ are empirically derived from said incandescent lamp;
   (f) determining a first estimated operational circuit resistance $(R_{w1})$ from the following equation:

$$R_{w1}=V_1/I_1-k_1*V_2/I_2;$$

(g) determining a second estimated operational circuit resistance ($R_{w2}$) from the following equation:

$$R_{w2} = V_1/I_1 - k_1*(V_2 - R_{w1}*I_2)/I_2;$$

(h) approximating a lamp constant ($k_2$) from the following equation:

$$k_2 \approx I_2 \sqrt{(V_2 - R_{w2}*I_2)}; \text{ and}$$

(i) calculating the output voltage from said power source that will produce said desired lamp voltage at said lamp from the following equation:

$$V_c = V_{initial} + R_{w2}*k_2*\sqrt{V_{initial}}.$$

3. The method as claimed in claim 2 wherein said constant $k_1''$ is approximately 0.1.

4. The method as claimed in claim 2 wherein said constant $k_1'$ is approximately 1.

5. The method as claimed in claim 1 wherein steps (b) and (d) include measuring said voltages and currents at least two times and averaging the results.

6. The method as claimed in claim 1 wherein said first voltage and current measurements are taken at approximately ten percent of the normal lamp operating current.

7. The method as claimed in claim 1 wherein said second voltage and current measurements are taken at approximately the normal lamp operating temperature.

8. The method as claimed in claim 1 wherein said resistor value yields less than approximately 20 percent of normal lamp current.

9. The method as claimed in claim 1 further comprising the step of repeating steps (a)–(f) for another lamp.

10. The method as claimed in claim 9 wherein said lamps are connected in parallel.

* * * * *

UNITED STATES PATENT AND TRADEMARK OFFICE
CERTIFICATE OF CORRECTION

PATENT NO. : 6,396,289 B1
DATED : May 28, 2002
INVENTOR(S) : Jerry C. Schmitt

It is certified that error appears in the above-identified patent and that said Letters Patent is hereby corrected as shown below:

<u>Column 6, lines 16-67 through Column 8, lines 1-8,</u>
Claims 1-10, should read:

1. A microprocessor-based signal lamp controller for setting the operating voltage applied to an incandescent lamp comprising:

a variable electrical power supply for providing electrical power at a variable voltage for an incandescent lamp;

a microprocessor for selectively controlling an output of the power supply for providing electrical power to the lamp at an initial lamp voltage for testing the lamp, and at an operating voltage for operating the lamp;

a test circuit comprising a resistor in series with said lamp and said power supply;

at least one monitor for measuring a first voltage across said test circuit and a first current therein; and generating signals indicative of said first voltage and said first current as digital data transmitted to said microprocessor;

an operational circuit comprising said lamp and said power supply without said resistor;

at least one monitor for measuring a second voltage across said operational circuit and a second current therein and generating signals indicative of said second voltage and said second current as digital data transmitted to said microprocessor; and said microprocessor determining a first operational circuit resistance and a second operational circuit resistance, herein said second operational circuit resistance is derived from said first operational circuit resistance, determining a page setting for the operation of the lamp from said second operational circuit resistance, storing said voltage setting in a memory, and controlling said output of said power supply to provide electrical power to the lamp at said voltage setting.

2. A method of determining the output voltage ($V_c$) of a power source necessary to produce a desired lamp voltage at an incandescent lamp remote therefrom using voltage and current measurements at the power source comprising:

(a) applying an initial lamp voltage ($V_{initial}$) to a first electrical circuit comprising a resistor in series with said incandescent lamp;

(b) measuring a first voltage ($V_1$) across said first circuit, and measuring a first current ($I_1$) therein;

(c) applying said initial lamp voltage to a second electrical circuit comprising said incandescent lamp without said resistor;

(d) measuring a second voltage ($V_2$) across said second circuit, and measuring a second current ($I_2$) therein;

(e) deriving a cold lamp resistance constant ($k_1$) from the following equation:
$$k_1 = k_1' + k_1'' \cdot (I_1/I_2)^2;$$
wherein $k_1'$ and $k_1''$ are empirically derived from said incandescent lamp;

(f) determining a first estimated operational circuit resistance ($R_{w1}$) from the following equation:
$$R_{w1} = V_1/I_1 - k_1 \cdot V_2/I_2;$$

(g) determining a second estimated operational circuit resistance ($R_{w2}$) from the following equation:
$$R_{w2} = V_1/I_1 - k_1 \cdot (V_2 - R_{w1} \cdot I_2)/I_2;$$

(h) approximating a lamp constant ($k_2$) from the following equation:
$$k_2 \approx I_2/\sqrt{(V_2 - R_{w2} \cdot I_2)}; \text{ and}$$

(i) calculating the output voltage from said power source that will produce said desired lamp voltage at said lamp from the following equation:
$$V_c = V_{initial} + R_{w2} \cdot k_2 \cdot \sqrt{V_{initial}}.$$

UNITED STATES PATENT AND TRADEMARK OFFICE
CERTIFICATE OF CORRECTION

PATENT NO. : 6,396,289 B1
DATED : May 28, 2002
INVENTOR(S) : Jerry C. Schmitt

It is certified that error appears in the above-identified patent and that said Letters Patent is hereby corrected as shown below:

3. The method as claimed in claim 2 wherein said constant $k1'$ is approximately 0.1.

4. The method as claimed in claim 2 wherein said constant $k1''$ is approximately 1.

5. The method as claimed in claim 2 wherein steps (b) and (d) include measuring said voltages and currents at least two times and averaging the results.

6. The method as claimed in claim 2 wherein said first voltage and current measurements are taken at approximately ten percent of the normal lamp operating current.

7. The method as claimed in claim 2 wherein said second voltage and current measurements are taken at approximately the normal lamp operating temperature.

8. The method as claimed in claim 2 wherein said resistor value yields less than approximately 20 percent of normal lamp current.

9. The method as claimed in claim 2 further comprising the step of repeating steps (a)-(i) for another lamp.

10. The method as claimed in claim 9 wherein said lamps are connected in parallel.

Signed and Sealed this

Thirteenth Day of May, 2003

JAMES E. ROGAN
*Director of the United States Patent and Trademark Office*